United States Patent
Lee

(10) Patent No.: US 10,733,940 B2
(45) Date of Patent: Aug. 4, 2020

(54) ORGANIC LIGHT EMITTING DISPLAY DEVICE AND METHOD FOR DRIVING THE SAME

(71) Applicant: LG DISPLAY CO., LTD., Seoul (KR)

(72) Inventor: Taekyeong Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/144,682

(22) Filed: Sep. 27, 2018

(65) Prior Publication Data

US 2019/0096336 A1    Mar. 28, 2019

(30) Foreign Application Priority Data

Sep. 28, 2017  (KR) .................... 10-2017-0126235

(51) Int. Cl.
*G09G 3/3291* (2016.01)
*H01L 27/32* (2006.01)
*G09G 3/3266* (2016.01)
*G09G 3/3233* (2016.01)

(52) U.S. Cl.
CPC ......... *G09G 3/3291* (2013.01); *G09G 3/3233* (2013.01); *G09G 3/3266* (2013.01);
(Continued)

(58) Field of Classification Search
CPC .. G09G 3/3291; G09G 3/3233; G09G 3/3266; G09G 2310/0262;
(Continued)

(56) References Cited

U.S. PATENT DOCUMENTS 9,595,227 B2    3/2017  Yang et al.
9,727,186 B2    8/2017  Yang
(Continued)

FOREIGN PATENT DOCUMENTS

| CN | 106057126 A | 10/2016 |
| CN | 106663407 A | 5/2017 |
| CN | 106057126 B | * 4/2019 |
| EP | 3 147 894 A1 | 3/2017 |

OTHER PUBLICATIONS

Wu Tong, Translation of -A kind of pixel circuit and its driving method, CN106057126B, pp. 1-7 (Year: 2016).*

*Primary Examiner* — Ibrahim A Khan
(74) *Attorney, Agent, or Firm* — Birch, Stewart, Kolasch & Birch, LLP

(57) ABSTRACT

An organic light-emitting display device can include an organic light-emitting element; a driving transistor connected in series with the organic light-emitting element, the driving transistor and the organic light-emitting element being between a first driving power supply line for supplying a first driving voltage and a second driving power supply line for supplying a second driving voltage lower than first driving voltage; a first transistor configured to turn on based on an i-th scan signal and supply a data voltage to a first node, where i is a natural number greater than or equal to 2 and less than or equal to N, and N is a number of scan-lines; a capacitor between the first node and a gate electrode of the driving transistor, the capacitor is configured to supply a turn-on signal of the driving transistor to the gate electrode of the driving transistor based on the data voltage; and a second transistor configured to turn on based on a (i−1)-th scan signal and supply a first reference voltage to a second node, in which the second node is disposed between the driving transistor and the capacitor, and the capacitor is between the first and second nodes.

18 Claims, 7 Drawing Sheets

(52) U.S. Cl.
CPC ... *H01L 27/3244* (2013.01); *G09G 2300/043* (2013.01); *G09G 2300/0426* (2013.01); *G09G 2300/0819* (2013.01); *G09G 2300/0861* (2013.01); *G09G 2310/0262* (2013.01); *G09G 2310/061* (2013.01); *G09G 2310/08* (2013.01); *G09G 2320/043* (2013.01)

(58) Field of Classification Search
CPC ..... G09G 2300/0861; G09G 2320/043; G09G 2310/061; G09G 2300/0819; G09G 2300/0426; G09G 2300/043; G09G 2310/08; G09G 3/3208; G09G 3/3258; H01L 27/3244
See application file for complete search history.

(56) References Cited

U.S. PATENT DOCUMENTS

| | | | |
|---|---|---|---|
| 10,417,960 B2* | 9/2019 | Xiang | G09G 3/3233 |
| 10,482,820 B2* | 11/2019 | Lin | G09G 3/3258 |
| 2013/0057532 A1* | 3/2013 | Lee | G09G 3/3225 |
| | | | 345/211 |
| 2016/0035276 A1 | 2/2016 | Yin et al. | |
| 2016/0203794 A1* | 7/2016 | Lim | G09G 3/3225 |
| | | | 345/213 |
| 2017/0025062 A1* | 1/2017 | Wang | G09G 3/3233 |
| 2017/0186375 A1* | 6/2017 | Jung | G09G 3/3233 |
| 2017/0263183 A1* | 9/2017 | Lin | G09G 3/3233 |
| 2018/0130409 A1* | 5/2018 | Xiang | G09G 3/3225 |
| 2018/0211593 A1* | 7/2018 | Zhang | G09G 3/3233 |
| 2019/0057648 A1* | 2/2019 | Xu | G09G 3/3275 |
| 2019/0096336 A1* | 3/2019 | Lee | G09G 3/3266 |

* cited by examiner

ORGANIC LIGHT EMITTING DISPLAY DEVICE AND METHOD FOR DRIVING THE SAME

CROSS-REFERENCE TO RELATED APPLICATION

This application claims priority to and the benefit of Korean Patent Application No. 10-2017-0126235, filed in the Republic of Korea on Sep. 28, 2017, the disclosure of which is incorporated herein by reference in its entirety.

BACKGROUND

Technical Field

The present disclosure relates to an active-matrix scheme-based organic light-emitting display device including a compensation circuit, and a method for driving the same.

Related Art

A display device applies to a variety of electronic devices, such as TVs, mobile phones, notebooks and tablets. Therefore, studies are being continued to develop thinner, lighter and lower-power consuming display devices.

A typical example of the display device may include a liquid crystal display device (LCD), a plasma display panel device (PDP), a field emission display device (FED), an electro luminescence display device (ELD), an electrowetting display device (EWD) and, an organic light-emitting display device (OLED), etc.

The organic light-emitting display device includes a plurality of organic light-emitting elements corresponding to a plurality of pixels, respectively. The organic light-emitting element is a self-luminous element that emits light by itself. Thus, the organic light-emitting display device has a faster response speed than the liquid crystal display device. Further, the OLED has a high luminous efficiency, a high luminance and a wide viewing angle, and is excellent in contrast ratio and color reproducibility.

The organic light-emitting display device may be implemented in an active-matrix scheme in which multiple pixels are driven individually.

The active-matrix scheme-based organic light-emitting display device includes a driving element that supplies a driving current to the organic light-emitting element of each pixel. In this connection, the driving element is usually implemented as a thin film transistor. Further, in general, the driving element and the organic light-emitting element are connected in series between a first driving power source and a second driving power source having a lower potential than the first driving power source.

In order to prevent luminance differences between the pixels, a plurality of driving elements corresponding to a plurality of pixels respectively need to be designed so that electrical characteristics of the driving elements, such as the threshold voltages and the mobilities, are the same as each other. However, due to process conditions, driving environments, driving times, etc., uniformity between the electrical characteristics of the plurality of driving elements may be reduced.

Particularly, due to driving stress, the threshold voltage of the driving element may fluctuate. In this instance, as the driving current is reduced due to the variation of the threshold voltage of the driving element, an image quality is deteriorated and the lifetime of the element is reduced.

In order to compensate for the difference between the threshold voltages of the driving elements, each pixel of the organic light-emitting display device may include a compensation circuit.

The compensation circuit within each pixel circuit is intended to automatically compensate for the threshold voltage differences between the driving elements. That is, due to the presence of the compensation circuit, the driving current supplied to the organic light-emitting element may not correspond to the threshold voltage of the driving element.

In general, when each pixel contains a compensation circuit, the organic light-emitting display device initializes a gate electrode of the driving element and an anode of the organic light-emitting element using an initialization voltage for an initialization period. Thus, the compensation circuit comprises at least one thin film transistor connected to an initialization power supply for supplying an initialization voltage.

However, for the initialization period, a gate-source voltage Vgs of the driving transistor may be above the threshold voltage. At this time, as the first driving power supply with a relatively high potential and the initialization power supply are short-circuited with each other through the turned-on driving transistor. Thus, a ripple may occur in the initialization power supply. Due to the ripple in the initialization power supply, the gate electrode of the driving element and the anode of the organic light-emitting element may not be properly initialized. As a result, there is a problem that a luminance deviation is caused between the pixels, thereby causing a stain and an abnormal luminance.

SUMMARY

This Summary is provided to introduce a selection of concepts in a simplified form that are further described below in the Detailed Description. This Summary is not intended to identify all the features of the claimed subject matter, nor is it intended to be used alone as an aid in determining the scope of the claimed subject matter.

The present disclosure is directed to an organic light-emitting display device, and a method for driving the device, which can prevent the ripple in the initialization power supply.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided an organic light-emitting display device including an organic light-emitting element; a driving transistor connected in series with the organic light-emitting element, in which the driving transistor and the organic light-emitting element are disposed between and are connected to first and second driving power supply lines, the first driving power supply line supplies first driving voltage and the second driving power supply line supplies second driving voltage which is lower than the first driving voltage; a first transistor, in which when the first transistor turns on based on an i-th scan signal, a data voltage is supplied to a first node via the turned-on first transistor, where i is a natural number equal to or greater than 2 and smaller than or equal to N, where N is a number of scan-lines; a capacitor disposed between the first node and a gate electrode of the driving transistor, in which the capacitor supplies a turn-on signal to the gate electrode of the driving transistor based on the data voltage; and a second transistor, in which when the second transistor turns on based on a (i−1)-th scan signal, a first reference voltage is supplied to a second node via the turned-on second transistor, the second node is disposed between the driving transistor and the capacitor, and the capacitor is disposed between the first and second nodes.

In one embodiment, the organic light-emitting display device further includes a third transistor, in which when the third transistor turns on based on an emission signal, a second reference voltage is supplied to the first node via the turned-on third transistor; a fourth transistor is disposed between and coupled to the second node and a third node, in which the driving transistor is disposed between the first driving power supply line and the third node, and the fourth transistor turns on based on the i-th scan signal; a fifth transistor is disposed between and coupled to the third node and an anode of the organic light-emitting element, in which the fifth transistor turns on based on the emission signal; and a sixth transistor, and when the sixth transistor turns on based on the i-th scan signal, the first reference voltage is supplied to a fourth node via the turned-on sixth transistor, in which the fourth node is disposed between the fifth transistor and the anode, and one of first and second electrodes of the driving transistor is connected to the first driving power supply line, while the other of the first and second electrodes of the driving transistor is connected to the third node, and a cathode of the organic light-emitting element is connected to the second driving power supply line.

In one embodiment, the organic light-emitting display device further includes a seventh transistor, and when the seventh transistor turns on based on the (i−1)-th scan signal, the second reference voltage is supplied to the first node via the turned-on seventh transistor.

In one embodiment of the organic light-emitting display device, the first and second reference voltages have different voltage levels, in which the second transistor is coupled to a first reference power supply line for supplying the first reference voltage, and the third transistor is coupled to a second reference power supply line for supplying the second reference voltage.

In one embodiment of the organic light-emitting display device, the first and second reference voltages have different voltage levels, in which the first reference voltage have the same voltage level as a voltage level of the second driving voltage, the second transistor is connected to the second driving power supply line, the third transistor is coupled to a reference power supply line, and the reference power supply line supplies the second reference voltage different from the first reference voltage.

In one embodiment of the organic light-emitting display device, the first and second reference voltages have the same voltage level, in which the second and third transistors are connected to first and second reference power supply lines, respectively, and the first and second reference power supply lines supply the first and second reference voltages, respectively.

In one embodiment of the organic light-emitting display device, the first and second reference voltages have the same voltage level, in which the second and third transistors are connected to first and second reference power supply lines, respectively, and the first and second reference power supply lines supply the first and second reference voltages, respectively.

In one embodiment of the organic light-emitting display device, for a first period, the (i−1)-th scan signal is supplied at a turn-on level, while each of the i-th scan signal and the emission signal is supplied at a turn-off level, and for a second period, the i-th scan signal is supplied at a turn-on level, while each of the (i−1)-th scan signal and the emission signal is supplied at a turn-off level, and for a third period, all of the (i−1)-th scan signal, the i-th scan signal, and the emission signal are supplied at a turn-off level, and for a fourth period, the emission signal is supplied at a turn-on level, while each of the (i−1)-th scan signal and the i-th scan signal is supplied at a turn-off level.

In another aspect of the present disclosure, there is provided a method for driving an organic light-emitting display device, in which the organic light-emitting display device includes an organic light-emitting element; a driving transistor connected in series with the organic light-emitting element, in which the driving transistor and the organic light-emitting element are disposed between and are connected to first and second driving power supply lines, the first driving power supply line supplies first driving voltage and the second driving power supply line supplies second driving voltage which is lower than the first driving voltage; a first transistor, in which when the first transistor turns on, a data voltage is supplied to a first node via the turned-on first transistor; a capacitor disposed between the first node and a gate electrode of the driving transistor; and a second transistor connected to a second node, in which the second node is disposed between a gate electrode of the driving transistor and the capacitor, and the capacitor is disposed between the first and second nodes, the method includes initializing the second node to a first reference voltage by turning on the second transistor for a first period; and turning off the second transistor and supplying the data voltage to the first node by turning on the first transistor for a second period.

In one embodiment of the method for driving the organic light-emitting display device, the organic light-emitting display device further includes a third transistor coupled to the first node; a fourth transistor disposed between the second node and the third node, in which the third node is disposed between the emitting element and driving transistor; a fifth transistor coupled to and disposed between the third node and an anode of the organic light-emitting element; and a sixth transistor coupled to a fourth node between the fifth transistor and the anode, and the method further includes turning on the fourth transistor for the second period, to sample the second node using a difference voltage between the first driving voltage supplied from the first driving power supply and a threshold voltage of the driving transistor; and supplying the first reference voltage by turning on the sixth transistor to the fourth node.

In one embodiment of the method for driving the organic light-emitting display device, the method further includes turning off the first to sixth transistors and boosting a potential of the second node for a third period; for a fourth period, turning on the driving transistor based on a turn-on signal corresponding to the potential of the second node; turning on the third transistor to supply a second reference voltage to the first node; and turning on the fifth transistor such that a driving current from the turned-on driving transistor is supplied to the organic light-emitting element.

In one embodiment of the method, the organic light-emitting display device further includes a seventh transistor coupled to the first node, in which the method further includes initializing the first node to the second reference voltage by turning on the seventh transistor for the first period.

In one embodiment of the method, the first and second reference voltages have different voltage levels.

In one embodiment of the method, the first reference voltage has the same voltage level as a voltage level of the second driving voltage.

In one embodiment of the method, the first and second reference voltages have the same voltage level.

The organic light-emitting display device according to one embodiment of the present disclosure includes the transistor for initializing the node between the driving transistor and the capacitor to the reference voltage for an initialization period. In this connection, the transistor is turned on based on the signal (i−1)-th scan signal corresponding to the previous scan-line. This prevents a short circuit from occurring between the initialization power supply for supplying the reference voltage and the high potential driving power supply for the initialization period. In this way, the embodied invention can suppress ripples in the initialization power supply. Thus, an initialization driving failure due to the ripple in the power supply can be prevented and can remove the luminance deviation between the pixels, which can suppress stains or blemishes and abnormal luminance.

DETAILED DESCRIPTION OF THE EMBODIMENTS

Figure 1:
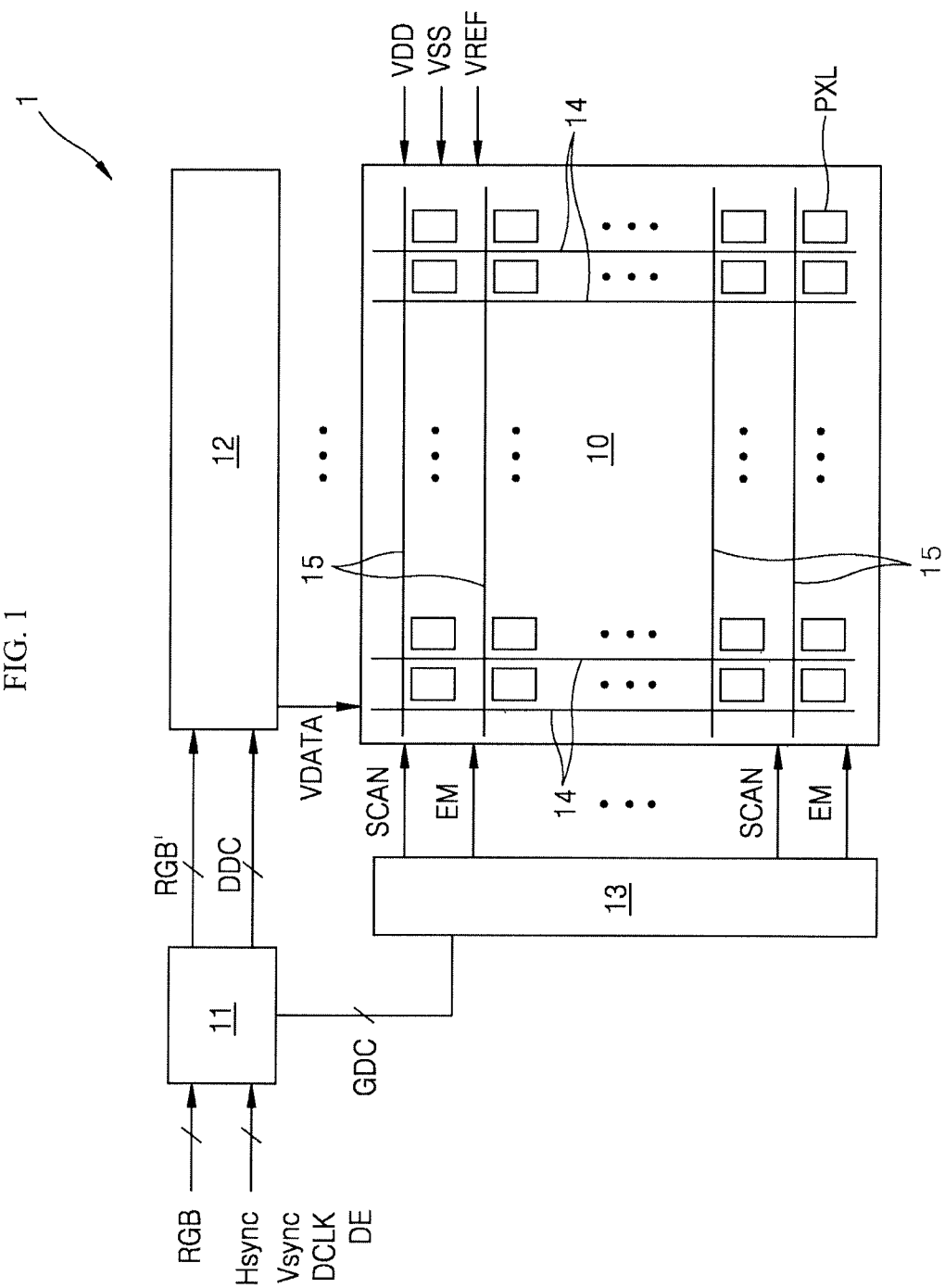
FIG. 1 illustrates an organic light-emitting display device according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

When an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expressions, such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, an organic light-emitting display device according to embodiments of the present disclosure and a method for driving the device will be described in detail with reference to the accompanying drawings.

First, an organic light-emitting display device according to a first embodiment of the present disclosure and a method for driving the device will be described with reference to FIGS. 1 to 3.

FIG. 1 illustrates an organic light-emitting display device according to a first embodiment of the present disclosure. FIG. 2 shows an equivalent circuit corresponding to any one pixel in an organic light-emitting display device according to the first embodiment of the present disclosure. FIG. 3 shows a waveform of a driving signal in FIG. 2 and an associated potential at each node.

As illustrated in FIG. 1, an organic light-emitting display device 1 according to a first embodiment of the present disclosure includes a display panel 10 including a plurality of pixel PXLs, a data driving circuit 12 for driving data-lines 14 of the display panel 10, a gate driving circuit 13 for driving scan-lines 15 of the display panel 10, and a timing controller 11 for controlling the driving timing of the data driving circuit 12 and the gate driving circuit 13

The display panel 10 includes scan-lines 15 and data-lines 14 that intersect with each other. A plurality of pixel regions corresponding to the plurality of pixel PXLs, respectively, are defined as the intersection regions between the scan-lines 15 and the data-lines 14, respectively. As a result, the plurality of pixel regions are arranged in a matrix form in the display region.

In addition, the display panel 10 further includes, per each horizontal line of the plurality of pixel PXLs, an emission-line for supplying an emission signal EM, a first driving power supply line for supplying a first driving voltage VDD, a second driving power supply line for supplying a second driving voltage VSS having a potential lower than the first driving voltage VDD, a reference power supply line for supplying a reference voltage VREF via an initialization power supply.

In this connection, the reference voltage VREF is set to a potential lower than a trigger voltage of the organic light-emitting element. In one embodiment, the display panel 10 can include first and second reference power supply lines connected to first and second initialization power supplies, respectively, for supplying first and second reference voltages having different voltage levels.

The timing controller 11 rearranges digital video data RGB input from the outside based on a resolution of the display panel 10. The controller 11 supplies the rearranged digital video data RGB' to the data driving circuit 12.

Further, the timing controller 11 generates and outputs a data control signal DDC for controlling operation timing of the data driving circuit 12, and a gate control signal GDC for controlling operation timing of the gate driving circuit 13, based on timing signals, such as a vertical synchronization signal Vsync, a horizontal synchronization signal Hsync, a dot clock signal DCLK, and a data enable signal DE, etc.

The data driving circuit 12 converts the rearranged digital video data RGB' into an analog data voltage based on the data control signal DDC. Further, the data driving circuit 12 supplies a data signal (e.g., VDATA in FIG. 2) to the pixels in each horizontal line for each horizontal period based on the rearranged digital video data RGB'.

The gate driving circuit 13 can generate a scan signal SCAN and an emission signal EM based on the gate control signal GDC. The gate driving circuit 13 can include a scan drive unit and an emission drive unit. The scan drive unit can sequentially supply a scan signal SCAN to the scan lines in each horizontal line. The emission drive unit can supply the emission signal EM to the emission lines in each horizontal line for each horizontal period.

The gate driving circuit 13 can be disposed in a non-display region in the display panel 10 in a GIP (Gate-Driver In Panel) mode.

Figure 2:
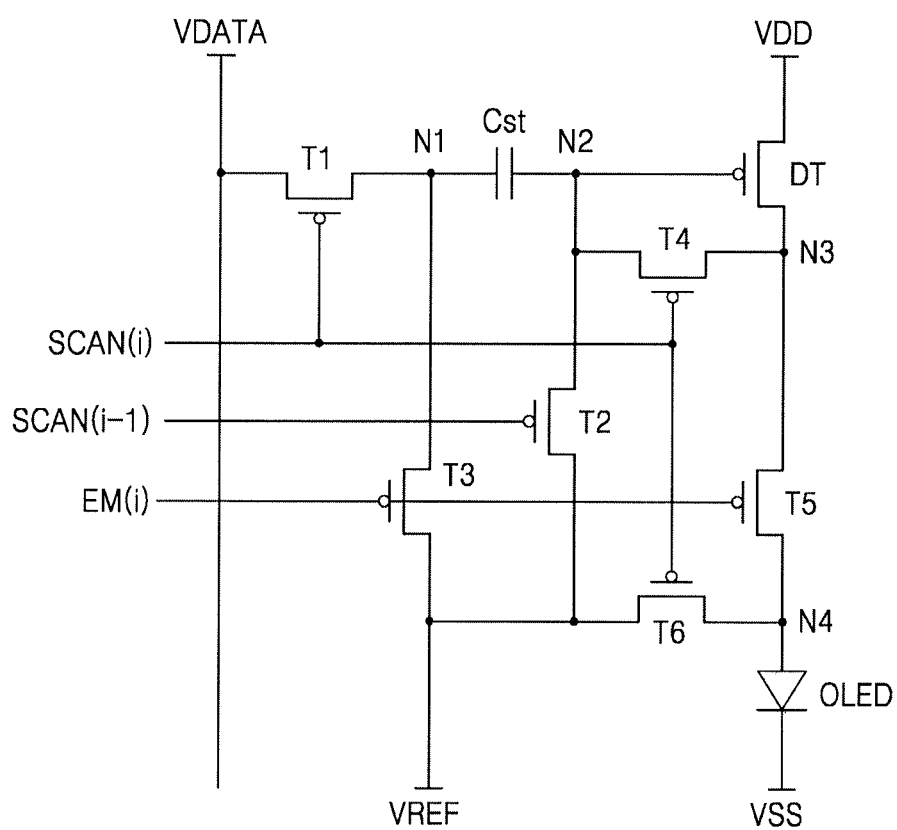
FIG. 2 illustrates an equivalent circuit corresponding to any one pixel in an organic light-emitting display device according to an embodiment of the present disclosure.

As illustrated in FIG. 2, in the organic light-emitting display device 10 according to the first embodiment, each of the plurality of pixel PXLs includes an organic light-emitting element OLED, a driving transistor DT, first to sixth transistors T1, T2, T3, T4, T5, and T6, and a capacitor Cst.

In each pixel PXL, the driving transistor DT, the first transistor T1, and the capacitor Cst together define a pixel driving circuit for supplying driving current to the organic light-emitting element OLED for each frame, while the remaining second to sixth transistors T2 to T6 together define a compensation circuit for compensating the threshold voltage of the driving transistor DT.

The pixel illustrated in FIG. 2 can be one of pixels arranged in the i-th horizontal line among a plurality of pixels. In this connection, i is greater than 2 and i is a natural number smaller than N, and N is the total number of horizontal lines.

The organic light-emitting element OLED can include an anode and a cathode, and an organic light-emitting layer disposed therebetween. By way of example, the organic light-emitting layer includes a hole injection layer, a hole transport layer, a light emitting layer, and an electron transport layer. Alternatively, the organic light-emitting layer may further include an electron injection layer.

The driving transistor DT is connected in series with the organic light-emitting element OLED and is disposed between the first driving power supply line for supplying the first driving voltage VDD and the second driving power supply line for supplying the second driving voltage VSS having a potential lower than the first driving power supply.

In the driving transistor DT, a gate electrode thereof is connected to the capacitor Cst. One of first and second electrodes (source electrode and drain electrode) thereof is connected to the first driving power supply VDD, while the other thereof is connected to a third node N3.

When this driving transistor DT turns on based on a turn-on signal supplied from the capacitor Cst, the organic light-emitting element OLED is supplied with the driving current.

When a first transistor T1 is turned on based on an i-th scan signal SCAN(i) (i is a natural number larger than 2 and smaller than N), the data voltage VDATA is supplied to the first node N1.

In this first transistor T1, a gate electrode thereof is connected to an i-th scan-line for supplying the i-th scan signal SCAN(i). One of first and second electrodes (source electrode and drain electrode) thereof, for example, the source electrode, is connected to a data-line for supplying the data voltage VDATA, while the other thereof, for example, the drain electrode, is connected to the first node N1. The first node N1 is a joint point between the first transistor T1 and the capacitor Cst.

The capacitor Cst is connected between the first node N1 and a second node N2. The second node N2 is a joint point between the capacitor Cst and the driving transistor DT.

That is, a first electrode of the capacitor Cst is connected to the first node N1 receiving the data voltage VDATA via the first transistor T1, while a second electrode of the capacitor Cst is connected to the second node N2 corresponding to the gate electrode of the driving transistor DT.

This capacitor Cst supplies the turn-on signal to the gate electrode of the driving transistor DT at least based on the data voltage VDATA.

When the second transistor T2 turns on based on an (i−1)-th scan signal SCAN(i−1), a reference voltage VREF is supplied to the second node N2. In this connection, the (i−1)-th scan signal SCAN(i−1) is a signal supplied via a (i−1)-th scan-line corresponding to a previous horizontal line.

A gate electrode of the second transistor T2 is connected to the (i−1)-th scan-line for supplying the (i−1)-th scan signal SCAN(i−1). One of first and second electrodes (source and drain electrodes) of the second transistor T2, for example, the source electrode, is connected to a reference power supply line for supplying the reference voltage VREF, while the other thereof, for example, the drain electrode, is connected to the second node N2.

When a third transistor T3 turns on based on an emission signal EM(i) corresponding to the i-th horizontal line, the reference voltage VREF is supplied to the first node N1.

A gate electrode of the third transistor T3 is connected to the i-th emission-line for supplying the emission signal EM(i). One of first and second electrodes (source and drain electrodes) of the transistor T3, for example, the source electrode, is connected to the reference power supply line for supplying the reference voltage VREF, while the other thereof, for example, the drain electrode, is connected to the first node N1.

A fourth transistor T4 is connected between the second node N2 and the third node N3, and turns on based on the i-th scan signal SCAN(i).

The second node N2 corresponds to the gate electrode of the driving transistor DT. The third node N3 corresponds to the second electrode of the driving transistor DT, for example, the drain electrode, which is not connected to the first driving power supply VDD. That is, the fourth transistor T4 is disposed between the gate electrode and the drain electrode of the driving transistor DT.

Specifically, a gate electrode of the fourth transistor T4 is connected to the i-th scan-line for supplying the i-th scan signal SCAN(i). One of first and second electrodes (source and drain electrodes) of the transistor T4, for example, the source electrode, is connected to the third node N3, while the other thereof, for example, the drain electrode is coupled to the second node N2.

When the fourth transistor T4 turns on, the gate electrode and the drain electrode of the driving transistor DT are connected to each other. As a result, a potential of the gate electrode of the driving transistor DT becomes close to a threshold voltage. In this connection, a difference voltage VDD-Vth between the first driving voltage VDD of the first driving power supply line and the threshold voltage of the driving transistor DT is supplied to the third node N3 via the driving transistor DT. Further, the difference voltage VDD-Vth of the third node N3 is supplied to the second node N2 via the turned-on fourth transistor T4.

The fifth transistor T5 is connected between the third node N3 and the anode of the organic light-emitting element OLED. The fifth transistor T5 turns on based on the emission signal EM(i).

A gate electrode of the fifth transistor T5 is connected to the i-th emission-line for supplying the emission signal EM(i). One of first and second electrodes (source electrode and drain electrode) of the fifth transistor T5, for example, the source electrode, is connected to the third node N3, while the other thereof, for example, the drain electrode, is connected to the anode of the organic light-emitting element OLED.

The cathode of the organic light-emitting element OLED is connected to the second driving power supply line which supplies the second driving voltage VSS.

When a sixth transistor T6 is turned on based on the i-th scan signal SCAN(i), the reference voltage VREF is supplied to a fourth node N4. The fourth node N4 is a joint point between the fifth transistor T5 and the organic light-emitting element OLED.

A gate electrode of the sixth transistor T6 is connected to the i-th scan-line for supplying the i-th scan signal SCAN(i). One of first and second electrodes (source electrode and drain electrode) of the sixth transistor T6, for example, the source electrode is connected to the reference power supply line, while the other thereof, for example, the drain electrode, is connected to the fourth node N4.

Figure 3:
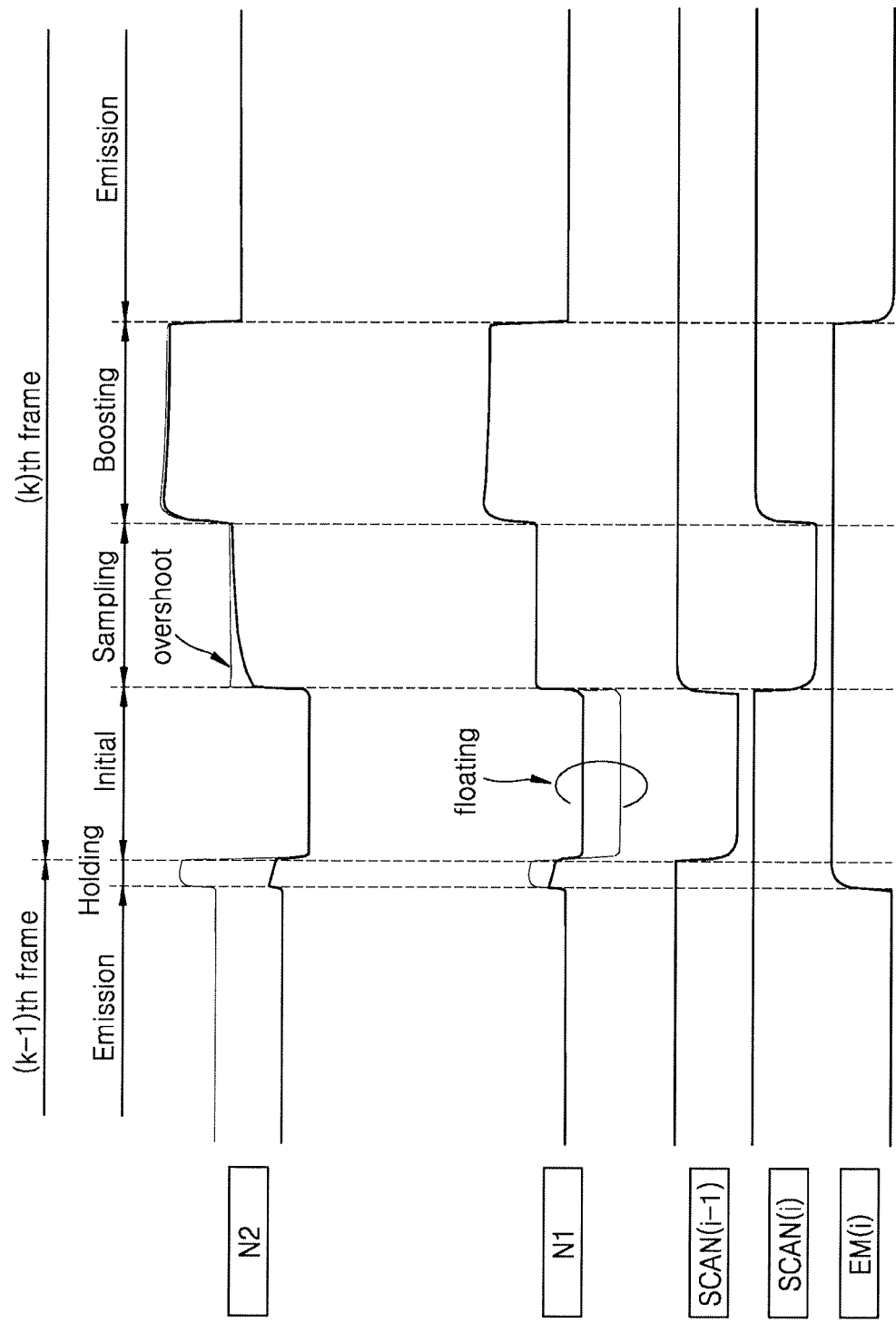
FIG. 3 illustrates a waveform of a driving signal in FIG. 2 and an associated potential at each node, according to an embodiment of the present disclosure.

As illustrated in FIG. 3, for an initialization period (Initial), the (i−1)-th scan signal SCAN (i−1), the i-th scan signal SCAN(i), and the emission signal EM(i) are supplied to the corresponding pixel PXL from the gate driving circuit (13 of FIG. 1). In this connection, the (i−1)-th scan signal SCAN(i−1) is supplied at a turn-on level (low level in FIG. 3), while each of the i-th scan signal SCAN(i) and the emission signal EM(i) is supplied at a turn-off level (high level in FIG. 3).

Thus, the second transistor T2 is turned on based on the (i−1)-th scan signal SCAN(i−1) at the turn-on level. Thus, via the turn-on second transistor T2, a potential of the second node N2 is initialized to the reference voltage VREF.

For a sampling period (Sampling), the i-th scan signal SCAN(i) is supplied at a turn-on level (low level in FIG. 3), while each of the (i−1)-th scan signal SCAN(i−1) and emission signal EM(i) is supplied at a turn-off level (high level in FIG. 3).

Thus, the second transistor T2 is turned off based on the (i−1)-th scan signal SCAN(i−1) at the turn-off level.

Further, the first transistor T1, the fourth transistor T4 and the sixth transistor T6 are turned on based on the i-th scan signal SCAN(i) at the turn-on level.

The data voltage VDATA is supplied to the first node N1, via the turned-on first transistor T1. That is, the data voltage VDATA is supplied to one end of the capacitor Cst.

A potential of the gate electrode of the driving transistor DT is gradually changed to be close to the threshold voltage of the driving transistor DT, via the turned-on fourth transistor T4. Thus, the difference voltage VDD-Vth between the first driving voltage VDD and the threshold voltage Vth of the driving transistor DT is supplied to the second node N2 via the driving transistor DT and the fourth transistor T4.

The reference voltage VREF is supplied to the fourth node N4 via the sixth transistor T6 which has been turned-on. This prevents the driving of the organic light-emitting element OLED for the sampling period (Sampling).

For a boosting period (Boosting), all of the (i−1)-th scan signal SCAN(i−1), the i-th scan signal SCAN(i) and the i-th emission signal EM(i) are supplied at a turn-off level. Thus, all of the first to sixth transistors T1, T2, T3, T4, T5, and T6, including the first, fourth, and sixth transistors T1, T4, and T6 are turned off.

In this connection, the potential of the second node N2 is boosted by parasitic capacitances of the capacitor Cst and of the fourth transistor T4.

Further, for an emission period (Emission), the emission signal EM(i) is supplied at turn-on level, while each of the (i−1)-th scan signal SCAN(i−1) and the i-th scan signal SCAN(i) is supplied at a turn-off level.

Thus, the third transistor T3 and the fifth transistor T5 are turned on based on the emission signal EM (i) at the turn-on level.

In this connection, the reference voltage VREF is supplied to the first node N1 via the third transistor T3 which has been turned on. As a result, a potential of the first node N1 changes from the data voltage VDATA to the reference voltage VREF ($\Delta V$=VDATA-VREF). Thus, a voltage of the second node N2 is decreased from the voltage VDD-Vth in the sampling period by the voltage change $\Delta V$=VDATA-VREF of the first node.

The driving current of the driving transistor DT corresponding to the voltage of the second node is supplied to the organic light-emitting element OLED via the fifth transistor T5 which has been turned-on.

In this way, according to a first embodiment of the present disclosure, for the initialization period (Initial in FIG. 3), the present configuration can turn on the second transistor T2, and, thus, initialize the second node N2, that is, the second electrode of the capacitor Cst, and the gate electrode of the driving transistor DT to the reference voltage VREF.

In this connection, the second transistor T2 is turned on based on the (i−1)-th scan signal SCAN(i−1), unlike the first, fourth and sixth transistors T1, T4 and T6. That is, when the second transistor T2 is turned on, the first, fourth, and sixth transistors T1, T4, and T6 are not turned on.

Thus, for the initialization period, a current path including the driving transistor DT, the fourth and sixth transistors T4 and T6 can be suppressed. Thus, the first driving power supply for supplying the first driving voltage VDD and the initialization power supply for supplying the reference voltage VREF are prevented from being connected to each other. As a result, the ripple in the initialization power supply may be suppressed.

Further, for the initialization period (Initial in FIG. 3), in order to initialize the second electrode of the capacitor Cst and the gate electrode of the driving transistor DT to the reference voltage VREF, the second transistor T2 can be turned on in a response to the (i−1)-th scan signal SCAN (i−1), e.g., a signal supplied through a scan line corresponding to a previous horizontal line.

Therefore, separate signal line and signal supply unit for supplying the signal for turning on the second transistor T2 and are unnecessary. That is, since the gate driving circuit (e.g., 13 in FIG. 1) can be implemented as a scan drive unit and an emission drive unit corresponding to each horizontal line, the gate driving circuit 13 can be designed simply and easily. As a result, a width of a bezel region in the organic light-emitting display device can be reduced due to the GIP-based gate driving circuit 13.

For the initialization period (Initial), the potential of the second node N2 is initialized to the reference voltage VREF, while the potential of the first node N1 is in a floating state (floating).

Thus, for the initialization period (Initial), a charging voltage of the capacitor Cst in a previous frame ((k−1)-th frame) is not properly initialized.

Therefore, there is a problem that the potential of the second node N2 fluctuates depending on a luminance in the previous frame ((k−1)-th frame) at an initial timing of the sampling period.

Specifically, as shown by a relatively thin solid line with respect to the potential of the second node N2 in FIG. 3, there is a problem that the potential of the second node N2 may have an overshoot waveform at an initial point of the sampling period, especially when a black luminance is expressed in the previous frame ((k−1)-th frame).

Therefore, according to the first embodiment, a luminance difference occurs between horizontal lines depending on the luminance in the previous frame ((k−1)-th frame).

To solve this problem, in accordance with the present disclosure, a second embodiment is provided in which both potentials of the first and second nodes N1 and N2 are initialized for the initialization period (Initial).

Figure 4:
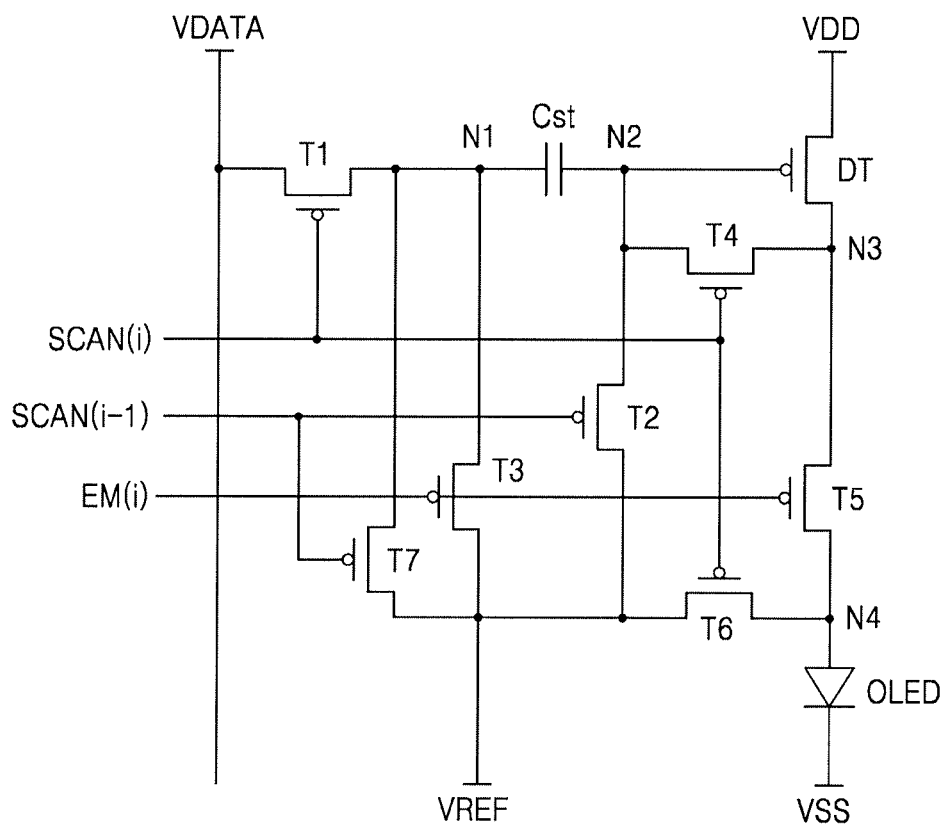
FIG. 4 illustrates an equivalent circuit corresponding to any one pixel in an organic light-emitting display device according to another embodiment of the present disclosure.
Figure 5:
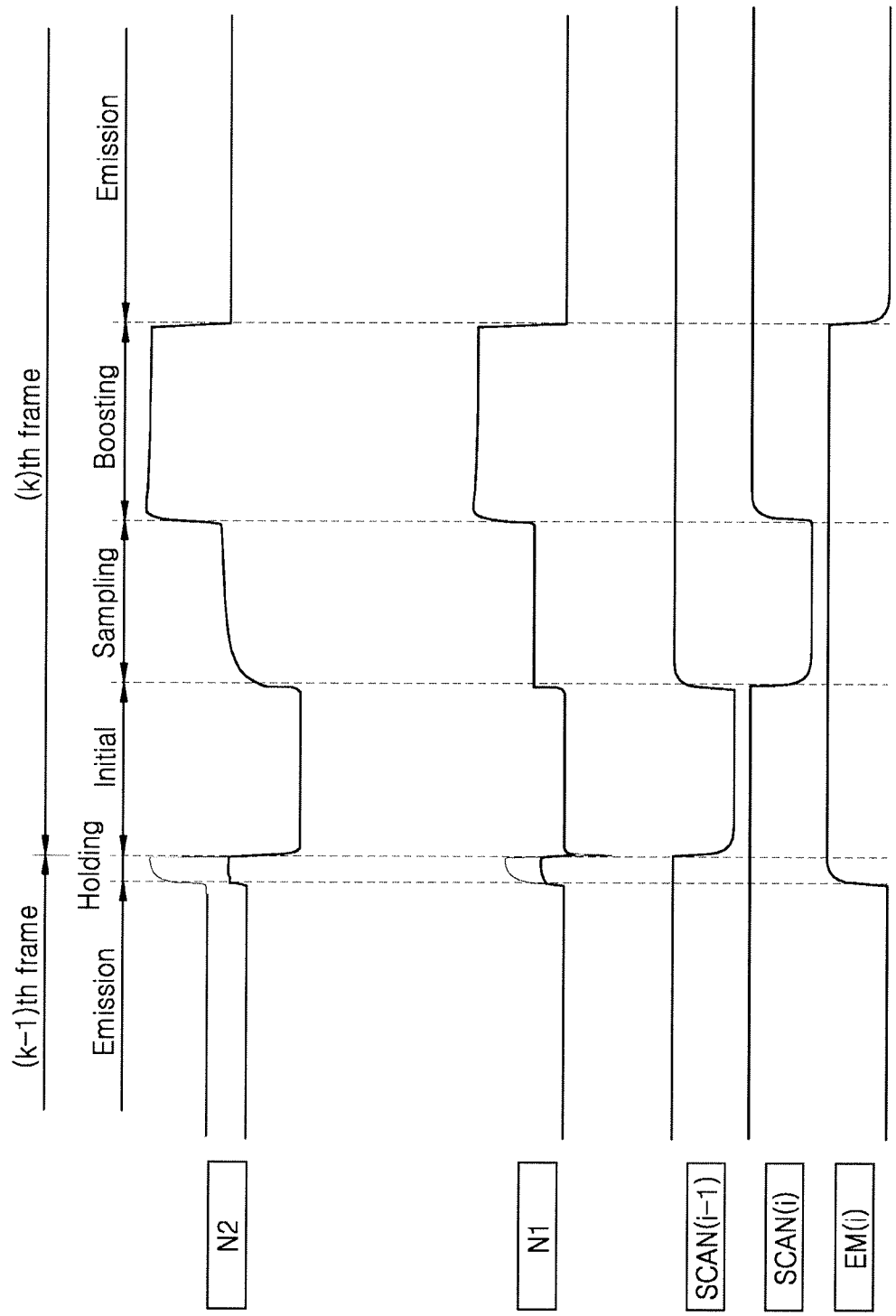
FIG. 5 illustrates a waveform of a driving signal in FIG. 4 and an associated potential at each node, according to an embodiment of the present disclosure.

FIG. 4 shows an equivalent circuit corresponding to any one pixel in an organic light-emitting display device according to the second embodiment of the present disclosure. FIG. 5 shows a waveform of a driving signal in FIG. 4 and an associated potential at each node according to the second embodiment of the present disclosure.

As illustrated in FIG. 4, the organic light-emitting display device according to the second embodiment of the present disclosure further includes a seventh transistor T7. When the seventh transistor T7 is turned on based on the (i−1)-th scan signal SCAN(i−1), the reference voltage VREF is supplied to the first node N1 via the turned-on seventh transistor T7. Except for the presence of the seventh transistor T7, a configuration of the second embodiment is the same as that of the first embodiment illustrated in FIGS. 1 to 3. Therefore, the descriptions of the overlapping portions between the first and second embodiments may be omitted.

As illustrated in FIG. 4, the seventh transistor T7 is connected between the first node N1 and the reference power supply line for supplying the reference voltage VREF.

A gate electrode of the seventh transistor T7 is connected to the (i−1)-th scan line for supplying the (i−1)-th scan signal SCAN(i−1). One of first and second electrodes (e.g., source electrode and drain electrode) of the seventh transistor T7, for example, the source electrode is connected to the reference power supply line for supplying the reference voltage VREF, while the other thereof, for example, the drain electrode, is connected to the first node N1.

Further, as illustrated in FIG. 5, for the initialization period (Initial), each of the second transistor T2 and the seventh transistor T7 is turned on based on the (i−1)-th scan signal SCAN (i−1) at the turn-on level.

Thus, the potential of the second node N2 is initialized to the reference voltage VREF via the turned-on second transistor T2, while the potential of the first node N1 is initialized to the reference voltage VREF via the turned-on seventh transistor T7.

That is, for the initialization period (Initial), potentials of both ends of the capacitor Cst are initialized to the reference voltage VREF.

Thus, at the initial time of the sampling period, the potential of the second node N2 can be prevented from fluctuating depending on the luminance of the previous frame ((k−1)-th frame). Therefore, the luminance difference between horizontal lines depending on the luminance in the previous frame ((k−1)-th frame) can be suppressed.

Unlike the above first and second embodiments, in a third embodiment of the present disclosure, a reference voltage for initializing the first node N1 and a reference voltage for initializing the second node N2 can have different voltage levels.

Figure 6:
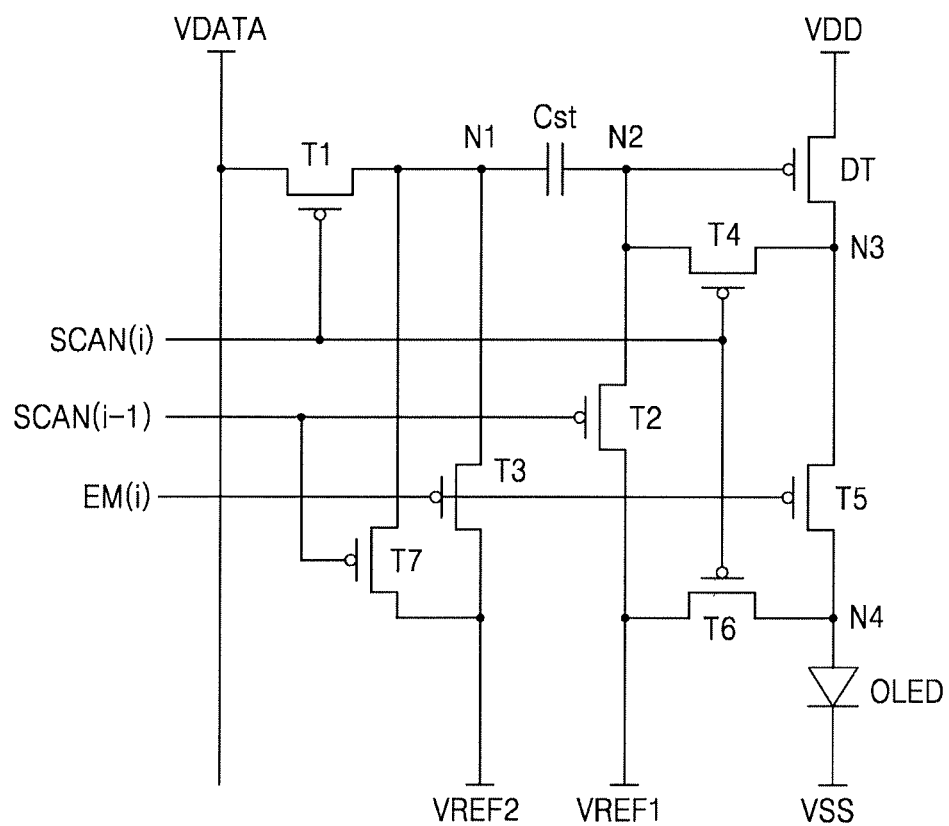
FIG. 6 illustrates an equivalent circuit corresponding to any one pixel in an organic light-emitting display device according to an embodiment of the present disclosure.

FIG. 6 shows an equivalent circuit corresponding to any one pixel in an organic light-emitting display device according to a third embodiment of the present disclosure.

As illustrated in FIG. 6, in the organic light-emitting display device according to the third embodiment of the present disclosure, when the second transistor T2 turns on, a first reference voltage VREF1 is supplied to the second node N2 via the turned-on second transistor T2. At the same time, when the seventh transistor T7 turns on, the first node N1 is supplied with a second reference voltage VREF2 which is different from the first reference voltage VREF1. A configuration of the third embodiment is the same as those of the first and second embodiments illustrated in FIGS. 1 to 5, except that, in the third embodiment, the first reference voltage for initializing the first node N1 and the second reference voltage for initializing the second node N2 have different voltage levels. Therefore, the descriptions of the overlapping portions between the first, second, and third embodiments may be omitted.

As illustrated in FIG. 6, when the second transistor T2 turns on based on the (i−1)-th scan signal SCAN(i−1), the first reference voltage VREF1 is supplied to the second node N2 via the turned-on second transistor T2.

Thus, one of first and second electrodes (e.g., source and drain electrodes) of the second transistor T2, for example, the source electrode, is connected to a first reference power supply line for supplying the first reference voltage VREF1, while the other thereof, for example, the drain electrode, is connected to the second node N2.

Further, when the seventh transistor T7 turns on based on the (i−1)-th scan signal SCAN(i−1), the second reference voltage VREF2 is supplied to the first node N1 via the turned-on seventh transistor.

Thus, one of first and second electrodes (source and drain electrodes) of the seventh transistor T7, for example, the source electrode, is connected to a second reference power supply line for supplying the second reference voltage VREF2, while the other thereof, for example, the drain electrode, is connected to the first node N1.

In this way, for the initialization period (Initial), the capacitor Cst can be initialized to a difference voltage between the first reference voltage VREF1 and the second reference voltage VREF2 (e.g., Cst=VREF2−VREF1).

As a result, a response speed in the sampling period can be easily adjusted via the first reference voltage VREF1 and the second reference voltage VREF2. Further, the third embodiment can allow easy compensation for degradation in overall pixels over the driving time of the organic light-emitting display device.

However, the first reference voltage (VREF1 in FIG. 6) according to the third embodiment can be set to a range similar to a range of an operation-trigger voltage (e.g., threshold voltage) of the organic light-emitting element OLED. Alternatively, due to deterioration of the organic light-emitting element OLED, the first reference voltage (VREF1 in FIG. 6) according to the third embodiment can be greater than or equal to the operation-trigger voltage of the organic light-emitting element OLED.

In this connection, when the first reference voltage (VREF1 in FIG. 6) according to the third embodiment is supplied to the fourth node N4 through an off-current of the sixth transistor T6, there is a problem that the organic light-emitting element OLED may malfunction. In order to solve such a problem, a fourth embodiment is provided according to an embodiment of the present invention.

Figure 7:
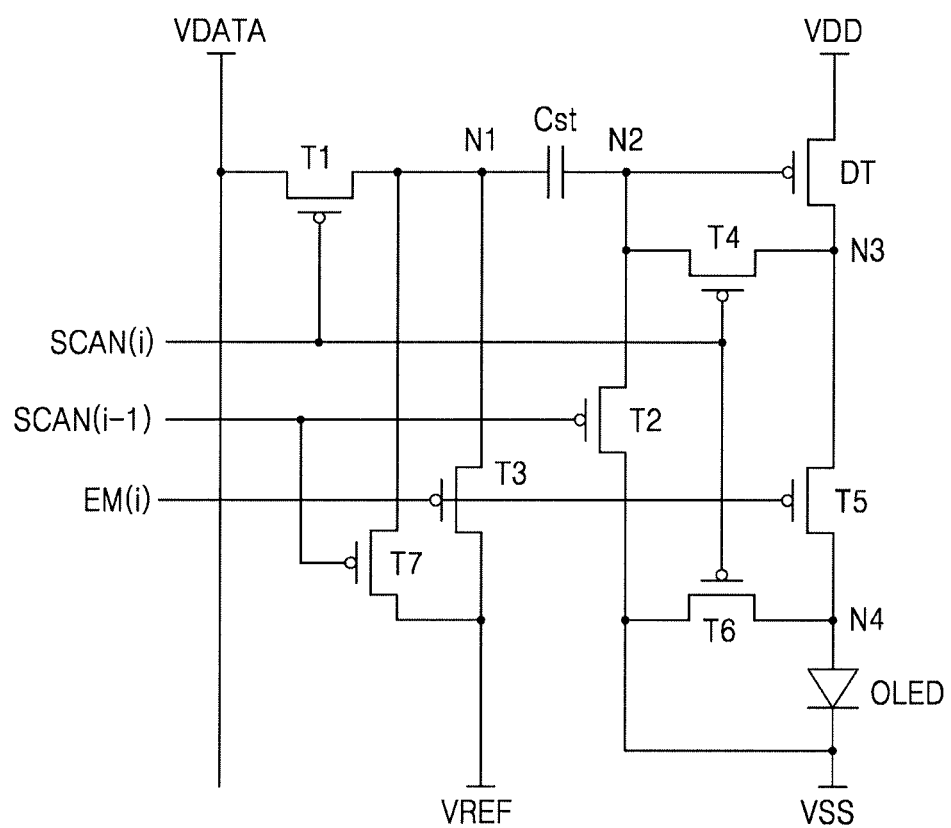
FIG. 7 illustrates an equivalent circuit corresponding to any one pixel in an organic light-emitting display device according to another embodiment of the present disclosure.

FIG. 7 shows an equivalent circuit corresponding to any one pixel in an organic light-emitting display device according to a fourth embodiment of the present disclosure.

In an organic light-emitting display device according to the fourth embodiment of the present disclosure, as illustrated in FIG. 7, when the second transistor T2 turns on, the second driving voltage VSS instead of the first reference voltage VREF1 is supplied to the second node N2. Further, when the sixth transistor T6 turns on, the second driving voltage VSS instead of the first reference voltage VREF1 is supplied to the fourth node N4. Except for this configuration, a remaining configuration of the fourth embodiment is the same as that of the third embodiment as illustrated in FIG. 6. Therefore, the descriptions of the overlapping portions between the third and fourth embodiments may be omitted.

As illustrated in FIG. 7, when the second transistor T2 turns on based on the (i−1)-th scan signal SCAN(i−1), the second driving voltage VSS is supplied to the second node N2 via the turned-on second transistor.

Thus, one of first and second electrodes (e.g., source and drain electrodes) of the second transistor T2, for example, the source electrode, is connected to the second driving power supply line for supplying the second driving voltage VSS, while, the other thereof, for example, the drain electrode, is connected to the second node N2.

When the seventh transistor T7 turns on based on the (i−1)-th scan signal SCAN(i−1), the reference voltage VREF is supplied to the first node N1 via the turned-on seventh transistor T7.

When the sixth transistor T6 is turned on based on the i-th scan signal SCAN(i), the second driving voltage VSS is supplied to the fourth node N4 via the turned-on sixth transistor T6.

Thus, one of first and second electrodes (source and drain electrodes) of the sixth transistor T6, for example, the source electrode, is connected to the second driving power supply line for supplying the second driving voltage VSS, while the other thereof, for example, the drain electrode, is connected to the fourth node N4.

In this way, even when the off-current of the sixth transistor T6 occurs, the second driving voltage VSS is supplied to the fourth node N4, that is, the anode of the organic light-emitting element OLED. Therefore, the organic light-emitting element OLED may be prevented from malfunctioning due to the off-current of the sixth transistor T6. Thus, an image quality of the device can be improved.

In the above description, numerous specific details are set forth in order to provide a thorough understanding of the present disclosure. The present disclosure can be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as can be included within the spirit and scope of the present disclosure as defined by the appended claims.

What is claimed is:

1. An organic light-emitting display device comprising:
an organic light-emitting element;
a driving transistor connected in series with the organic light-emitting element, the driving transistor and the organic light-emitting element being disposed between a first driving power supply line for supplying a first driving voltage and a second driving power supply line for supplying a second driving voltage lower than the first driving voltage;
a first transistor configured to turn on based on an i-th scan signal and supply a data voltage to a first node, wherein i is a natural number greater than or equal to 2 and less than or equal to N, and wherein N is a number of scan-lines;
a capacitor disposed between the first node and a gate electrode of the driving transistor, wherein the capacitor is configured to supply a turn-on signal of the driving transistor to the gate electrode of the driving transistor based on the data voltage;

a second transistor configured to turn on based on a (i−1)-th scan signal and supply a first reference voltage to a second node, wherein the second node is disposed between the driving transistor and the capacitor and the capacitor is disposed between the first and second nodes;

a third transistor configured to turn on based on an emission signal and supply a second reference voltage to the first node;

a fourth transistor disposed between the second node and a third node, wherein the driving transistor is disposed between the first driving power supply line and the third node, and wherein the fourth transistor is configured to turn on based on the i-th scan signal;

a fifth transistor disposed between the third node and an anode of the organic light-emitting element, wherein the fifth transistor turns on based on the emission signal;

a sixth transistor configured to turn on based on the i-th scan signal and supply the first reference voltage to a fourth node, wherein the fourth node is disposed between the fifth transistor and the anode; and a seventh transistor configured to turn on based on the (i−1)-th scan signal and supply the second reference voltage to the first node.

2. The organic light-emitting display device of claim 1, wherein one of first and second electrodes of the driving transistor is connected to the first driving power supply line, and the other of the first and second electrodes of the driving transistor is connected to the third node, and wherein a cathode of the organic light-emitting element is connected to the second driving power supply line.

3. The organic light-emitting display device of claim 1, wherein the first and second reference voltages have different voltage levels,
wherein the second transistor is coupled to a first reference power supply line for supplying the first reference voltage, and
wherein the third transistor is coupled to a second reference power supply line for supplying the second reference voltage.

4. The organic light-emitting display device of claim 1, wherein the first and second reference voltages have different voltage levels,
wherein the first reference voltage has a same voltage level as a voltage level of the second driving voltage,
wherein the second transistor is connected to the second driving power supply line, and
wherein the third transistor is coupled to a reference power supply line.

5. The organic light-emitting display device of claim 1, wherein the first and second reference voltages have a same voltage level, and
wherein the second and third transistors are connected to first and second reference power supply lines, respectively, and
wherein the first and second reference power supply lines are configured to supply the first and second reference voltages, respectively.

6. The organic light-emitting display device of claim 1, wherein during a first period, the (i−1)-th scan signal is supplied at a turn-on level, while each of the i-th scan signal and the emission signal is supplied at a turn-off level, wherein during a second period, the i-th scan signal is supplied at a turn-on level, while each of the (i−1)-th scan signal and the emission signal is supplied at a turn-off level,
wherein during a third period, all of the (i−1)-th scan signal, the i-th scan signal, and the emission signal are supplied at a turn-off level, and
wherein during a fourth period, the emission signal is supplied at a turn-on level, while each of the (i−1)-th scan signal and the i-th scan signal is supplied at a turn-off level.

7. The organic light-emitting display device of claim 1, wherein the first and second reference voltages have a same voltage level, and
wherein the second and third transistors are connected to first and second reference power supply lines, respectively, and
wherein the first and second reference power supply lines are configured to supply the first and second reference voltages, respectively.

8. The organic light-emitting display device of claim 1, wherein during a first period, the (i−1)-th scan signal is supplied at a turn-on level, while each of the i-th scan signal and the emission signal is supplied at a turn-off level,
wherein during a second period, the i-th scan signal is supplied at a turn-on level, while each of the (i−1)-th scan signal and the emission signal is supplied at a turn-off level,
wherein during a third period, all of the (i−1)-th scan signal, the i-th scan signal, and the emission signal are supplied at a turn-off level, and
wherein during a fourth period, the emission signal is supplied at a turn-on level, while each of the (i−1)-th scan signal and the i-th scan signal is supplied at a turn-off level.

9. A method for driving an organic light-emitting display device including an organic light-emitting element; a driving transistor connected in series with the organic light-emitting element, the driving transistor and the organic light-emitting element being disposed between a first driving power supply line for supplying a first driving voltage and a second driving power supply line for supplying a second driving voltage lower than the first driving voltage; a first transistor configured to turn on based on an i-th scan signal and supply a data voltage to a first node, wherein i is a natural number greater than or equal to 2 and less than or equal to N, and wherein N is a number of scan-lines; a capacitor disposed between the first node and a gate electrode of the driving transistor, wherein the capacitor is configured to supply a turn-on signal of the driving transistor to the gate electrode of the driving transistor based on the data voltage; a second transistor configured to turn on based on a (i−1)-th scan signal and supply a first reference voltage to a second node; a third transistor coupled to the first node; a fourth transistor disposed between the second node and a third node, wherein the driving transistor is disposed between the first driving power supply line and the third node; a fifth transistor disposed between the third node and an anode of the organic light-emitting element; and a sixth transistor coupled to a fourth node, wherein the fourth node is disposed between the fifth transistor and the anode; and a seventh transistor coupled to the first node, the method comprising:
for a first period, initializing the second node to the first reference voltage by turning on the second transistor and initializing the first node to a second reference voltage by turning on the seventh transistor, wherein the second node is disposed between the driving transistor and the capacitor, and wherein the capacitor is disposed between the first and second nodes; and supplying the data voltage to the first node by turning off the second transistor and turning on the first transistor for a second period.

10. The method of claim 9, wherein the method further comprises:

during the second period, sampling the second node using a difference voltage between the first driving voltage supplied from the first driving power supply line and a threshold voltage of the driving transistor by turning on the fourth transistor, while supplying the first reference voltage to the fourth node by turning on the sixth transistor.

11. The method of claim 9, wherein the method further comprises:

turning off the first, second, third, fourth, fifth and sixth transistors and boosting a potential of the second node for a third period;

for a fourth period, turning on the driving transistor based on a turn-on signal corresponding to the potential of the second node, turning on the third transistor to supply the second reference voltage to the first node, and turning on the fifth transistor and supplying a driving current from the driving transistor to the organic light-emitting element.

12. The method of claim 9, wherein the first and second reference voltages have different voltage levels.

13. The method of claim 12, wherein the first reference voltage has a same voltage level as a voltage level of the second driving voltage.

14. The method of claim 9, wherein the first and second reference voltages have a same voltage level.

15. The method of claim 9, wherein the first and second reference voltages have a same voltage level.

16. An organic light-emitting display device comprising:
an organic light-emitting element;
a driving transistor connected to the organic light-emitting element;
a first driving power supply line configured to supply a first driving voltage to the driving transistor;
a second driving power supply line configured to supply a second driving voltage to the organic light-emitting element, the second driving voltage being lower than the first driving voltage;
a first transistor configured to turn on based on an i-th scan signal and supply a data voltage to a first node, wherein i is a natural number greater than or equal to 2 and less than or equal to N, and wherein N is a number of scan-lines;
a capacitor disposed between the first node and a gate electrode of the driving transistor, wherein the capacitor is configured to supply a turn-on signal of the driving transistor to the gate electrode of the driving transistor based on the data voltage;
a second transistor configured to turn on based on a (i−1)-th scan signal and supply a first reference voltage to a second node, wherein the second node is disposed between the driving transistor and the capacitor and the capacitor is disposed between the first and second nodes;
a third transistor configured to turn on based on an emission signal and supply a second reference voltage to the first node;
a fourth transistor disposed between the second node and a third node;
a fifth transistor disposed between the third node and the organic light-emitting element;
a sixth transistor configured to turn on based on the i-th scan signal and supply the first reference voltage to a fourth node which disposed between the fifth transistor and the organic light-emitting element; and
a seventh transistor configured to turn on based on the (i−1)-th scan signal and supply the second reference voltage to the first node.

17. The organic light emitting display device of claim 16, wherein the first reference voltage and the second reference voltage have a same voltage level.

18. The organic light emitting display device of claim 16, wherein the first reference voltage is equal to the second driving voltage and the second transistor is connected to the second driving power supply line.

* * * * *